(12) United States Patent
Wagoner

(10) Patent No.: US 7,170,180 B2
(45) Date of Patent: Jan. 30, 2007

(54) METHODS AND SYSTEMS FOR IMPROVED CURRENT SHARING BETWEEN PARALLEL POWER SEMICONDUCTORS IN POWER CONVERTERS

(75) Inventor: Robert Gregory Wagoner, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 114 days.

(21) Appl. No.: 11/017,447

(22) Filed: Dec. 20, 2004

(65) Prior Publication Data
US 2006/0131668 A1   Jun. 22, 2006

(51) Int. Cl.
*H01L 23/48* (2006.01)
(52) U.S. Cl. .................. 257/773; 257/341
(58) Field of Classification Search .......... 257/773, 257/776, 341, 401
See application file for complete search history.

(56) References Cited

U.S. PATENT DOCUMENTS

| | | | |
|---|---|---|---|
| 5,459,356 A | * | 10/1995 | Schulze et al. ............ 257/773 |
| 5,508,652 A | | 4/1996 | Jekel |
| 5,572,417 A | | 11/1996 | Vinciarelli et al. |
| 5,621,631 A | | 4/1997 | Vinciarelli et al. |
| 5,638,263 A | | 6/1997 | Opal et al. |
| 5,672,920 A | | 9/1997 | Donegan et al. |
| 5,786,992 A | | 7/1998 | Vinciarelli et al. |
| 5,847,548 A | | 12/1998 | He et al. |
| 5,864,475 A | | 1/1999 | Ikawa et al. |
| 5,909,108 A | | 6/1999 | He et al. |
| 5,909,367 A | | 6/1999 | Change |
| 6,084,790 A | | 7/2000 | Wong |

\* cited by examiner

*Primary Examiner*—Mark V. Prenty
(74) *Attorney, Agent, or Firm*—Armstrong Teasdale LLP

(57) ABSTRACT

Methods and systems for current sharing between power semiconductors in an assembly are provided. The power semiconductor assembly includes a plurality of power semiconductors, each comprising at least one output conductor, the plurality of output conductors are electrically coupled together in parallel, an output bus network configured to transpose the output conductors such that magnetic fields causing a current output imbalance between the plurality of power semiconductors are substantially canceled.

32 Claims, 5 Drawing Sheets

METHODS AND SYSTEMS FOR IMPROVED CURRENT SHARING BETWEEN PARALLEL POWER SEMICONDUCTORS IN POWER CONVERTERS

BACKGROUND OF THE INVENTION

This invention relates generally to power semiconductors, and more particularly to methods and systems for current sharing between parallel connected power semiconductors.

At least some known power converters utilize power semiconductor switches. The power semiconductor switches' current outputs may be coupled in parallel when a desired output current is greater than the current capability of one power semiconductor switch by itself. Imbalance in current sharing between semiconductor switches coupled in parallel limit an amount of total output current that may be produced by the power converter. More specifically, in such instances, the highest stressed power semiconductor switch limits the power converter output, such that the lower stressed power semiconductor switches do not achieve their full capability.

Generally, an output current of power semiconductor switches is at least partially dependent on the electrical characteristics of each power semiconductor switch. Another factor which may affect the output of power semiconductor switches is magnetic interaction between the magnetic fields generated by each output current, and/or magnetic fields generated by other current carrying conductors or other sources, for example, one or more current return paths. In limited applications, power semiconductor switches may be positioned to facilitate minimizing such effects. However, multiple magnetic field sources and/or unknown magnetic field sources may make balancing output currents between power semiconductor switches difficult to achieve.

BRIEF DESCRIPTION OF THE INVENTION

In one aspect, a power semiconductor assembly is provided. The power semiconductor assembly includes a plurality of power semiconductors, each comprising at least one output conductor wherein the plurality of output conductors are electrically coupled together in parallel, an output bus network configured to transpose the output conductors such that magnetic fields causing a current output imbalance between the plurality of power semiconductors are substantially canceled.

In another aspect, a power converter is provided. The power converter includes a power semiconductor assembly comprising a plurality of power semiconductors having respective output conductors electrically coupled in parallel, the conductors are transposed about at least one axis such that magnetic fields causing a current output imbalance between the plurality of power semiconductor are substantially canceled, and a control unit for controlling the power semiconductor assembly to generate an electrical output.

In yet another aspect, a method of balancing output current in a power semiconductor assembly is provided. The power semiconductor assembly includes a plurality of power semiconductors wherein each power semiconductor includes at least one output current-carrying conductor. The method includes determining a relative orientation of the power semiconductors in the semiconductor assembly, and transposing the output conductors about at least one axis of symmetry defined by the relative orientation of the plurality of power semiconductors.

DETAILED DESCRIPTION OF THE INVENTION

Figure 1:
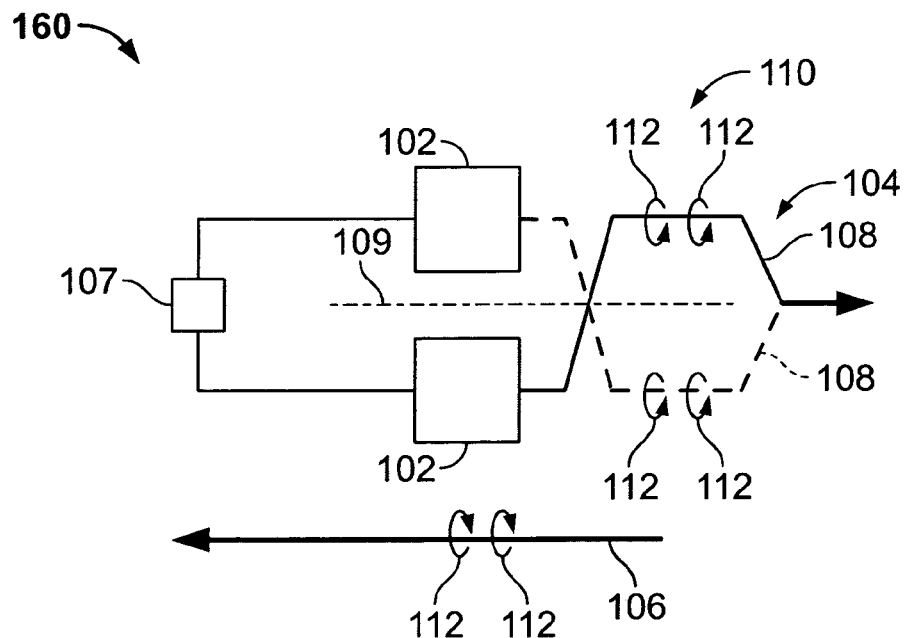
FIG. 1 is a side schematic view of an exemplary embodiment of a power semiconductor assembly.

FIG. 1 is a side schematic view of an exemplary embodiment of a power semiconductor assembly 100 that includes a plurality of power semiconductors 102, and an output bus network 104. Power semiconductor assembly 100 may also include a current return path 106. In the exemplary embodiment, two power semiconductors 102 are illustrated. Alternatively, more than two power semiconductors 102 may be included. Power semiconductors 102 may be power switches, for example, but are not limited to being metal oxide silicon field effect transistors (MOSFET), insulated gate bipolar transistors (IGBT), or other devices capable of performing the functions described herein. Power semiconductors 102 may be coupled to a control unit 107 for controlling power semiconductor assembly 100.

Output bus network 104 includes at least one output conductor 108 for each respective power semiconductor 102 that is electrically coupled in parallel. Current flowing in output conductor 108 generates a magnetic field 110 that radiates circumferentially from output conductor 108. Magnetic lines of flux 112 may interact with other magnetic lines of flux 112 radiating from other conductors 108. Such interaction may cause current in the respective generating conductors to vary in accordance with the interaction between the magnetic lines of flux 112. Output bus network 104 is configured such that output conductors 108 are transposed about an axis of symmetry 109. Accordingly, magnetic fields 110, which may cause an output current imbalance between the plurality of power semiconductors 102 substantially cancel each other.

A relative location of current return path 106 with respect to power semiconductors 102 may determine a configuration of output bus network 104 that facilitates canceling the magnetic fields that may cause an imbalance of output current from power semiconductors 102. Moreover, the location of current return path 106 causes the current sharing to be imbalanced, due to the magnetic flux path effectively pulling the output current toward current return path 106. As such, the current in output conductors 108 that lie closest to current return path 106 have relatively more current flow than output conductors 108 farther from current return path 106. In the exemplary embodiment, the relative location of current return path 106 is such that transposition in only one axis 109 is needed. It should be understood that magnetic fields from other sources may also interact with the magnetic fields generated by output conductors 108 to cause an imbalance of output currents between power semiconductors 102.

Figure 2:
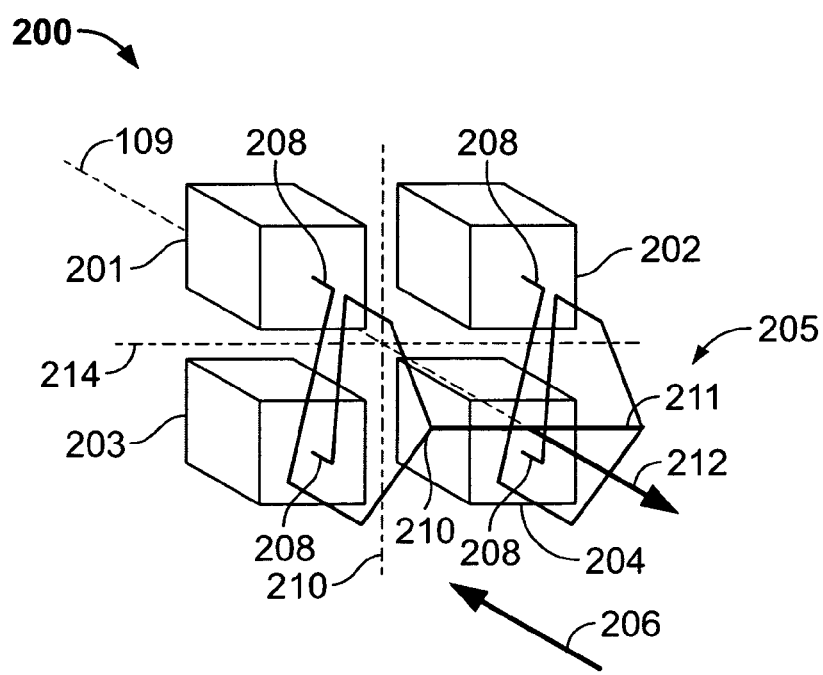
FIG. 2 is a perspective view of an exemplary embodiment of a power semiconductor assembly that includes four power semiconductors.

FIG. 2 is a perspective view of an exemplary embodiment of a power semiconductor assembly 200 that includes four power semiconductors 201, 202, 203, and 204, an output bus network 205. Power semiconductor assembly 200 may also include a current return path 206. In the exemplary embodiment, power semiconductors 201, 202, 203, and 204 are oriented in a two-by-two configuration. Alternatively, power semiconductors 201, 202, 203, and 204 may be oriented in other configurations. Output bus network 205 illustrates a transposition of a plurality of output conductors 208 about axis of symmetry 109 (shown in FIG. 1). An axis of symmetry 210 may also be defined vertically between power semiconductors 201 and 203, and 202 and 204.

In the exemplary embodiment, current return path 206 is substantially aligned with axis 210. When current return path 206 is substantially aligned with axes 109 or 210, transposition in only one axis is needed. Accordingly, output conductors 208 associated with power semiconductors 201 and 203 are transposed and output conductors 208 associated with power semiconductors 202 and 204 are transposed. Output conductors 208 are coupled together downstream of the transposition to form a combined output 211. Combined outputs 211 may be coupled together to form a power semiconductor assembly output 212.

In an alternative embodiment, current return path 206 is substantially aligned with respect to an axis 214 wherein output conductors associated with power semiconductors 201 and 202 are transposed and output conductors associated with power semiconductors 203 and 204 are transposed. Accordingly, the axis about which the transposition of output conductor 208 is made is substantially determined by the location of return path 206 with respect to power semiconductors 201, 202, 203, and 204, and the configuration of power semiconductors 201, 202, 203, and 204.

Figure 3:
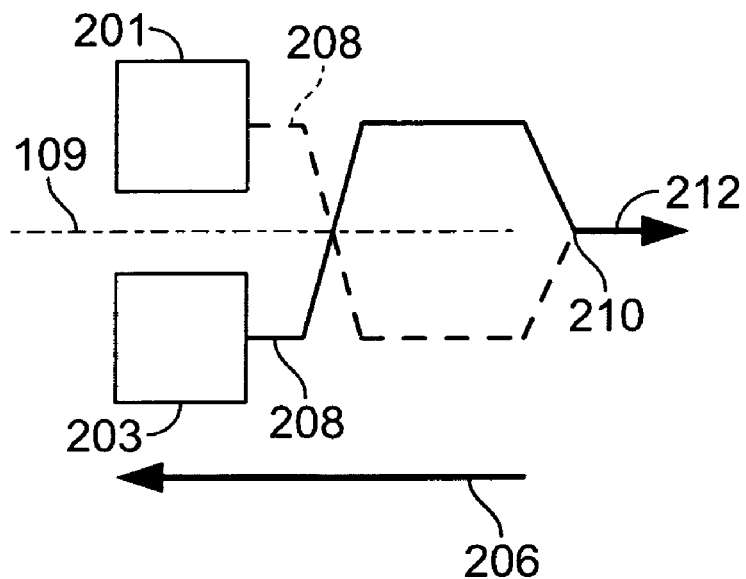
FIG. 3 is a side schematic view of an exemplary embodiment of the power semiconductor assembly shown in FIG. 2 and illustrating the transposition of output conductors associated with the power semiconductors about an axis.

FIG. 3 is a side schematic view of an exemplary embodiment of power semiconductor assembly 200 (shown in FIG. 2) and illustrates the transposition of output conductors 208 associated with power semiconductors 201 and 203 about axis 109. Transposition of output conductors 208 associated with power semiconductors 202 and 204 about axis 109 can not be seen in this view. Combined output 211 is formed by coupling output conductors 208 associated with power semiconductors 201 and 203 downstream of the transposition to form power semiconductor assembly output 212.

Figure 4:
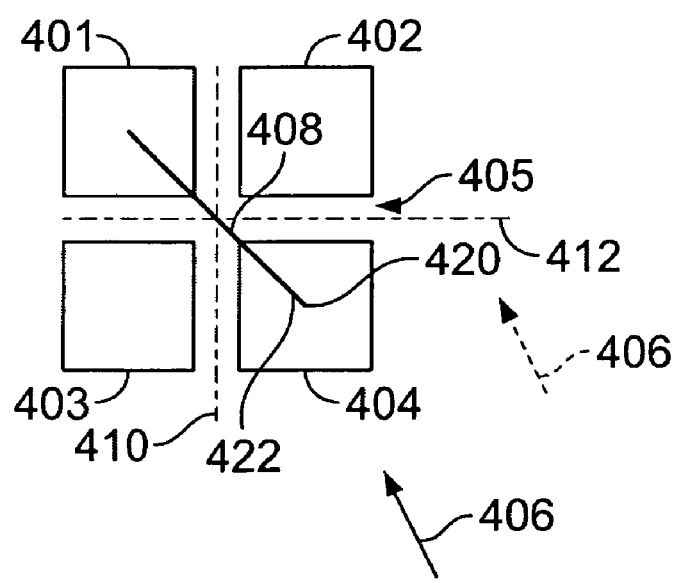
FIG. 4 is a front view of an exemplary embodiment of a power semiconductor assembly that includes four power semiconductors.
Figure 5:
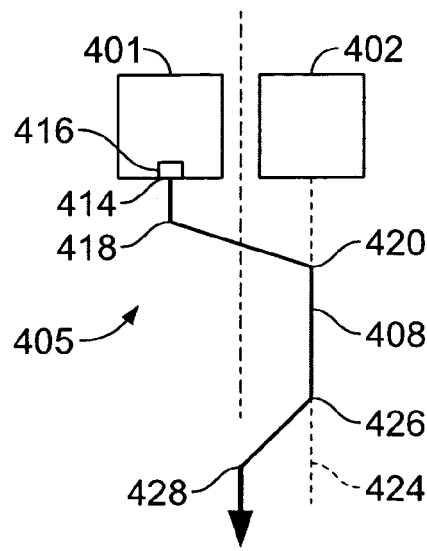
FIG. 5 is a top schematic view of an exemplary embodiment of the power semiconductor assembly shown in FIG. 4.
Figure 6:
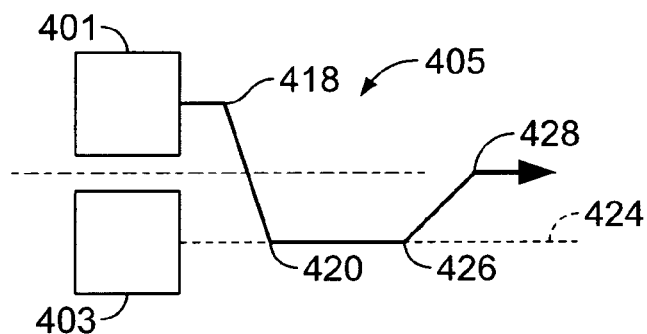
FIG. 6 is a side schematic view of an exemplary embodiment of the power semiconductor assembly shown in FIG. 4.

FIGS. 4, 5, and 6 are a respective front, top view, and side view of an exemplary embodiment of a power semiconductor assembly 400 that includes four power semiconductors 401, 402, 403, and 404, an output bus network 405, and a current return path 406 that includes multiple paths and/or paths that are not substantially aligned with respect to an axis of symmetry. An output conductor 408 associated with power semiconductor 401 is shown with output conductors associated with power semiconductors 402, 403, and 404 omitted for clarity. In the exemplary embodiment, power semiconductor assembly 400 includes multiple current return paths 406 and/or a current return path 406 that is not aligned with respect to a vertical axis of symmetry and/or a horizontal axis of symmetry, such that a transposition about two-axes is necessary to cancel the components of the magnetic fields that cause output current imbalance In the exemplary embodiment, four power semiconductors 401, 402, 403, and 404 are positioned in a two-by-two configuration and electrically coupled in parallel. Alternatively, power semiconductors 401 and 403 are positioned substantially symmetrically about a vertical axis 410 with respect to power semiconductors 402 and 404, and power semiconductors 401, 402 are positioned substantially symmetrically about a horizontal axis 412 and with respect to power semiconductors 403 and 404. A first contact 414 of output conductor 408 is coupled to a termination point 416 of power semiconductor 401. Output conductor 408 extends to a bend 418 that directs output conductor 408 diagonally toward a bend 420 that directs output conductor 408 away from power semiconductor 404 and substantially coincident with a line 424 extending normally from a midpoint 422 of power semiconductor 404. Output conductor 408 also extends along line 424 to a bend 426 that directs output conductor 408 back towards power semiconductor 401 and to a bend 428 positioned approximately normal to an intersection of axes 410 and 412. Output conductors associated with power semiconductors 402, 403, and 404 are not shown but, should be understood to follow complementary paths similar to the path of output conductor 408. The two-axis transposition of all four conductors of output bus network 405 facilitates canceling current imbalance in power semiconductors 401, 402, 403, and 404 from multiple current return paths 406 and/or a current return path 406 that is not directly aligned a vertical axis of symmetry and/or a horizontal axis of symmetry.

Figure 7:
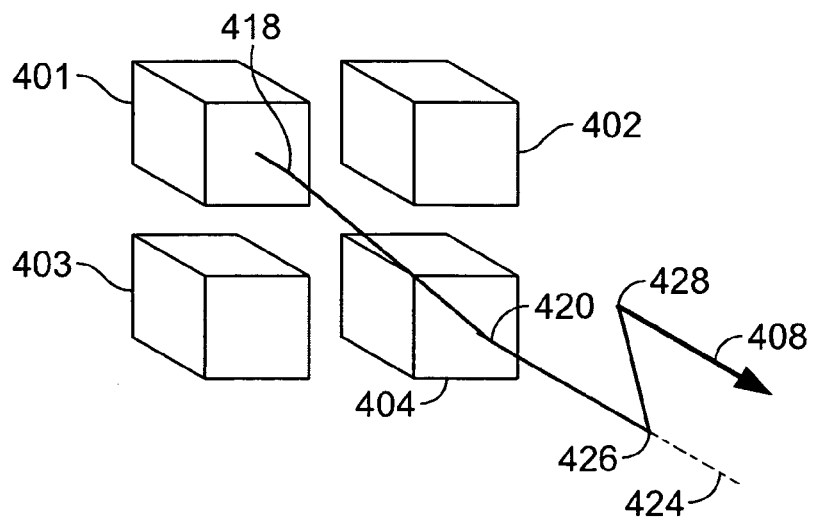
FIG. 7 is a perspective view of an alterative embodiment of the power semiconductor assembly shown in FIG. 4.

FIG. 7 is a perspective view of an exemplary embodiment of power semiconductor assembly 400 (shown in FIGS. 4, 5, and 6) that includes power semiconductors 401, 402, 403, and 404, output bus network 405, and current return path 406. A path of output conductor 408 is defined by bends 418, 420, 416, and 428 that directs output conductor 408 such that a magnetic field generated by the current flowing therethrough interacts with return current magnetic fields to facilitate minimizing output current imbalance between power semiconductors 401, 402, 403, and 404.

Figure 8:
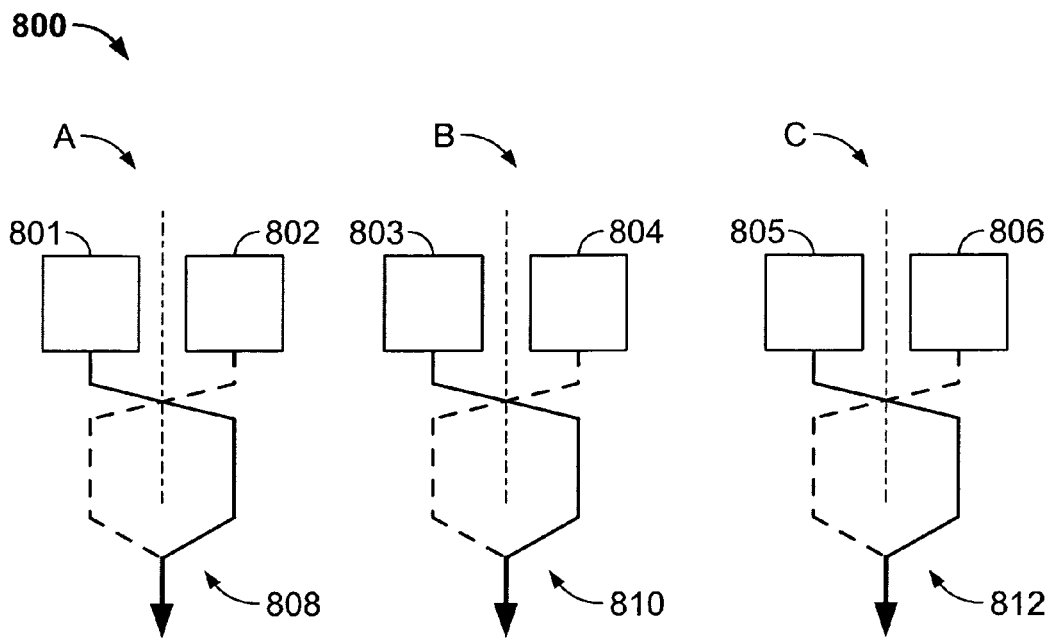
FIG. 8 is a top schematic view of an exemplary embodiment of a three phase power semiconductor assembly that includes a plurality of power semiconductors.

FIG. 8 is a top schematic view of an exemplary embodiment of a three phase power semiconductor assembly 800 that includes a plurality of power semiconductors 801, 802, 803, 804, 805, and 806, a plurality of output bus networks 808, 810, and 812. In the exemplary embodiment, two power semiconductors per electrical phase are illustrated. For example power semiconductors 801 and 802 are associated with a phase 'A', power semiconductors 803 and 804 are associated the a phase 'B', and power semiconductors 805 and 806 are associated the a phase 'C'. Output bus network s 808, 810, and 812 include at least one respective output conductor for each power semiconductor electrically coupled in parallel. FIG. 8 illustrates a balanced configuration for parallel operation of two power semiconductors per phase in a three phase circuit. By placing power semiconductors 801, 802, 803, 804, 805, and 806 in a single plane orients all current return paths in a single plane. This reduces the complexity of the transposition necessary for balanced current sharing. Because the return path for current is in the same plane as power semiconductors 801, 802, 803, 804, 805, and 806, a transposition in that same plane of the output conductors of the two power semiconductors in each phase causes the currents to balance.

Figure 9:
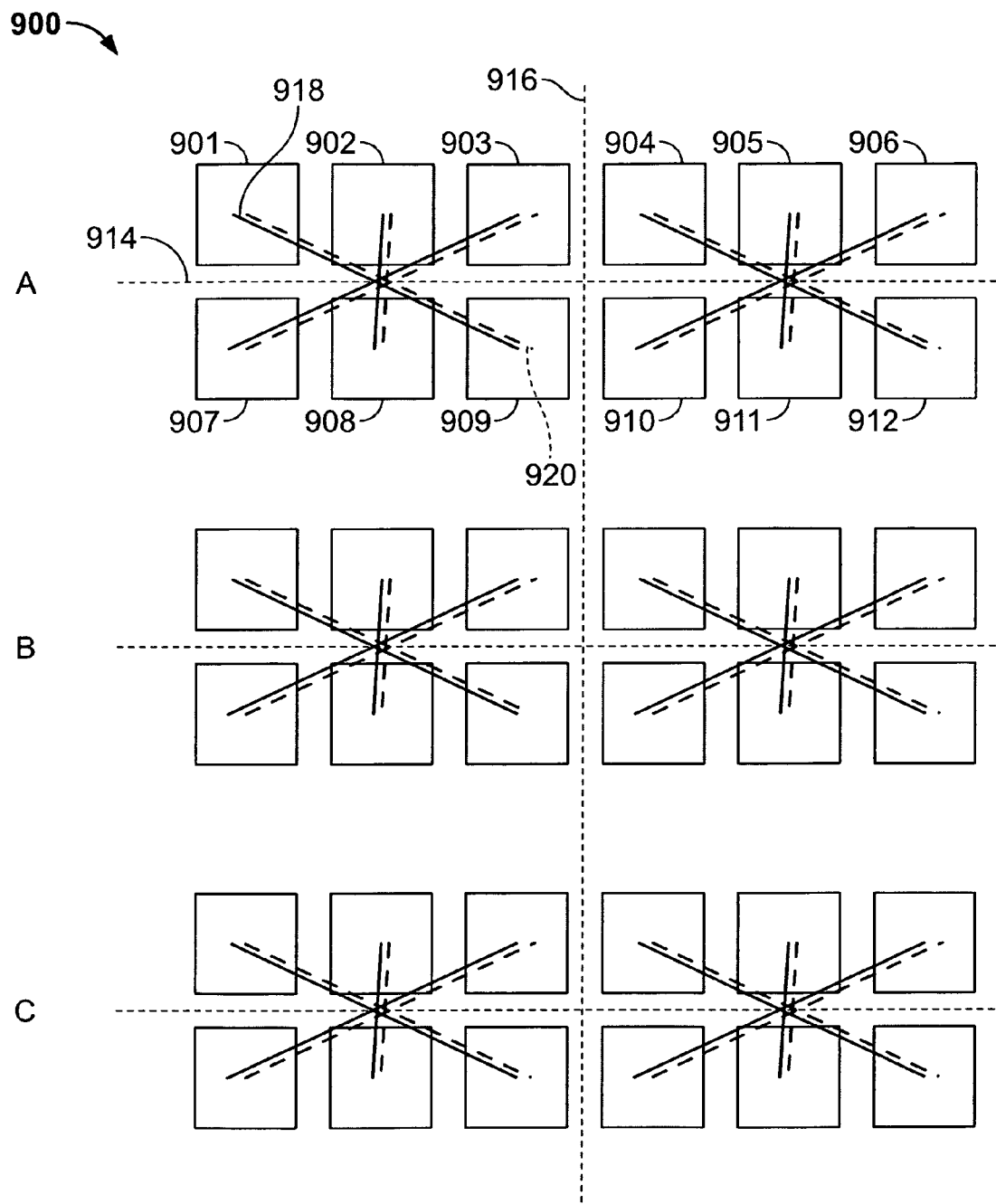
FIG. 9 is a front schematic view of an exemplary embodiment of a three phase power semiconductor assembly having twelve power semiconductors per phase.

FIG. 9 is a front schematic view of an exemplary embodiment of a three phase power semiconductor assembly 900 having twelve power semiconductors per phase. Each phase is configured substantially identically so only a first phase 'A' is discussed below in detail. In the exemplary embodiment, twelve power semiconductors 901, 902, 903, 904, 905, 906, 907, 908, 909, 910, 911, and 912 are positioned in a six-by-two configuration. Power semiconductors 901, 902, 903, 904, 905, 906 are symmetric about a horizontal axis 914 with respect to power semiconductors 907, 908, 909, 910, 911, and 912, and power semiconductors 901, 902, 903, 907, 908, and 909 are symmetric about a vertical axis 916 with respect to power semiconductors 904, 905, 906, 910, 911, and 912. In such a configuration, the respective current return paths for each respective phase lie in a single plane. In the exemplary embodiment, power semiconductors 901, 902, 903, 904, 905, 906, 907, 908, 909, 910, 911, and 912 are transposed about axes 914 and 916. Because magnetic fields caused by the current flowing in power semiconductors 901, 902, 903, 904, 905, 906, 907, 908, 909, 910, 911, and 912 and the return current path tends to direct current toward power semiconductors along the outside edge of power semiconductor assembly 900, a transposition of power semiconductors to balance the currents in power semiconductors 901, 902, 903, 904, 905, 906, 907, 908, 909, 910, 911, and 912 also, requires transposition of the output conductors of the power semiconductors positioned toward the outside edge of power semiconductor assembly 900 with the power semiconductors positioned toward the inside edge of power semiconductor assembly 900.

Similarly to the transposition described with reference to FIG. 7, each output conductor associated with each power semiconductor is channeled in three dimensional space from each power semiconductor output terminal (not shown) to a common output of power semiconductor assembly 900. For example, an output conductor 918 of power semiconductor 901 and an output conductor 920 of power semiconductor 909 are transposed with respect to each other. Output conductor 918 extends away from power semiconductor 901 then turns toward power semiconductor 909. In front of power semiconductor 909, output conductor 918 turns away from power semiconductor 909 and then turns back toward power semiconductor 901. At a point approximately midway between power semiconductors 902 and 908 output conductor 918 turns away from power semiconductors 901, 902, 903, 907, 908, and 909 and may be coupled to a common output of power semiconductors 904, 905, 906, 910, 911, and 912. In the exemplary embodiment, the output conductor associated with power semiconductor 902 is transposed with the output conductor associated with power semiconductor 908, the output conductor associated with power semiconductor 903 is transposed with the output conductor associated with power semiconductor 907, the output conductor associated with power semiconductor 904 is transposed with the output conductor associated with power semiconductor 912, the output conductor associated with power semiconductor 905 is transposed with the output conductor associated with power semiconductor 911, and the output conductor associated with power semiconductor 906 is transposed with the output conductor associated with power semiconductor 910.

Figure 10:
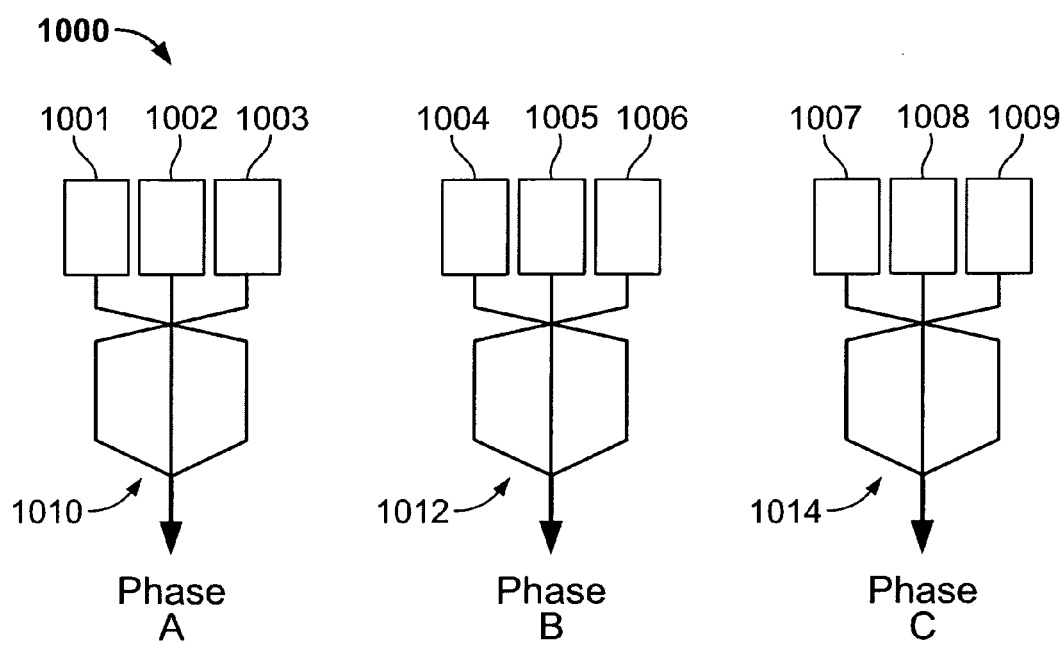
FIG. 10 is a top schematic view of an exemplary embodiment of a three phase power semiconductor assembly that includes a plurality of power semiconductors.

FIG. 10 is a top schematic view of an exemplary embodiment of a three phase power semiconductor assembly 1000 that includes a plurality of power semiconductors 1001, 1002, 1003, 1004, 1005, 1006, 1007, 1008, and 1009, a plurality of output bus networks 1010, 1012 and 1014. Power semiconductors 1001, 1002, 1003, 1004, 1005, 1006, 1007, 1008, and 1009 are aligned in a single plane making all current return paths lie in a single plane to facilitate reducing the complexity of the transposition necessary for balanced current sharing. Because the current return path is in the same plane as the power semiconductor, a transposition in that same plane of the output wiring of the two outside power semiconductors of each phase balances the currents.

The above-described methods and systems for current sharing between parallel connected power semiconductors is cost-effective and highly reliable for facilitating improving the output of power semiconductor assemblies. More specifically, the methods and systems described herein facilitate improving the current output of a plurality of parallel connected power semiconductors such that externally induced magnetic fields cause substantially equal effects in each current output conductor and current flow output between each power semiconductor is substantially equalized. As a result, the methods and systems described herein facilitate power semiconductor assembly output in a cost-effective and reliable manner.

Exemplary embodiments of power semiconductor assemblies and methods are described above in detail. The systems are not limited to the specific embodiments described herein, but rather, components of each system may be utilized independently and separately from other components described herein. Each system component can also be used in combination with other system components. In the exemplary embodiments described herein, a current return path of the power semiconductors is illustrated as being a the source of-the magnetic field that cause the current imbalance in the power semiconductor current outputs. It should be understood that magnetic fields from other sources may also interact with the magnetic fields generated by output conductors to cause an imbalance of output currents between power semiconductors.

While the invention has been described in terms of various specific embodiments, those skilled in the art will recognize that the invention can be practiced with modification within the spirit and scope of the claims.

What is claimed is:

1. A power semiconductor assembly comprising:
a plurality of power semiconductors, each comprising at least one output conductor, said plurality of output conductors are electrically coupled together in parallel; and
an output bus network configured to transpose said output conductors such that magnetic fields causing a current output imbalance between said plurality of power semiconductors are substantially canceled.

2. A power semiconductor assembly in accordance with claim 1 wherein said plurality of power semiconductors each comprise at least one of a metal oxide silicon field effect transistor (MOSFET) and an insulated gate bipolar transistor (IGBT).

3. A power semiconductor assembly in accordance with claim 1 wherein said plurality of output conductors are aligned substantially symmetrically with respect to a single axis.

4. A power semiconductor assembly in accordance with claim 3 wherein said plurality of output conductors are transposed about said single axis.

5. A power semiconductor assembly in accordance with claim 4 wherein said transposed output conductors are coupled together to form a combined output.

6. A power semiconductor assembly in accordance with claim 5 wherein a plurality of said combined outputs are coupled together to form a power semiconductor assembly output.

7. A power semiconductor assembly in accordance with claim 5 wherein a plurality of said combined outputs form a multi-phase power semiconductor assembly output.

8. A power semiconductor assembly in accordance with claim 1 wherein said plurality of output conductors are aligned substantially symmetrically with respect to a plurality of axes.

9. A power semiconductor assembly in accordance with claim 8 wherein said plurality of output conductors are transposed about each of said plurality of axes.

10. A power semiconductor assembly in accordance with claim 9 wherein said transposed output conductors are coupled together to form a combined output.

11. A power semiconductor assembly in accordance with claim 10 wherein a plurality of said combined outputs are coupled together to form a power semiconductor assembly output.

12. A power semiconductor assembly in accordance with claim 10 wherein a plurality of said combined outputs form a multi-phase power semiconductor assembly output.

13. A power converter comprising:
a power semiconductor assembly comprising a plurality of power semiconductors having respective output conductors electrically coupled in parallel, said conductors transposed about at least one axis such that magnetic fields causing a current output imbalance between said plurality of power semiconductor substantially cancel each other; and
a control unit for controlling said power semiconductor assembly to generate an electrical output.

14. A power converter in accordance with claim 13 wherein said power semiconductors comprise at least one of a metal oxide silicon field effect transistor (MOSFET) and an insulated gate bipolar transistor (TGBT).

15. A power converter in accordance with claim 13 wherein said output conductors are symmetric wit respect to a single axis.

16. A power converter in accordance with claim 15 wherein said output conductors are transposed about said single axis.

17. A power converter in accordance with claim 16 wherein said transposed output conductors are coupled together to form a combined output.

18. A power converter in accordance with claim 17 wherein a plurality of said combined outputs are coupled together to form a power converter output.

19. A power converter in accordance with claim 17 wherein a plurality of said combined outputs form a multi-phase power semiconductor assembly output.

20. A power converter in accordance wit claim 13 wherein said output conductors are symmetric with respect to a plurality of axes.

21. A power converter in accordance wit claim 20 wherein said output conductors are transposed about each of said plurality of axes.

22. A power converter in accordance with claim 21 wherein said transposed output conductors are coupled together to form a combined output.

23. A power converter in accordance with claim 22 wherein a plurality of said combined outputs are coupled together to form a power semiconductor assembly output.

24. A power converter in accordance with claim 22 wherein a plurality of said combined outputs form a multi-phase power semiconductor assembly output.

25. A method of balancing output current in a semiconductor assembly that includes a plurality of power semiconductors wherein each power semiconductor includes at least one output current-carrying conductor, said method comprising:
determining a relative orientation of te power semiconductors in the semiconductor assembly; and
transposing the output conductors about at least one axis of symmetry defined by the relative orientation of the plurality of power semiconductors.

26. A method in accordance with claim 25 further comprising determining a relative location of a power semiconductor current return path and wherein transposing the output conductors about at least one axis of symmetry comprises transposing the output conductors about at least one axis of symmetry with respect to the relative location of the power semiconductor current return path.

27. A method in accordance with claim 25 wherein determining a relative orientation of the power semiconductors in the semiconductor assembly comprises positioning the power semiconductors in a predetermined orientation with respect to each other.

28. A method in accordance with claim 25 further comprising determining a location of a power semiconductor current return path by positioning the power semiconductor current return path in a single plane with respect to the power semiconductors.

29. A method in accordance with claim 25 wherein the power semiconductors are positioned in a single plane with respect to each other, said method comprising transposing the output conductors about at least one axis of symmetry defined by the relative orientation of the power semiconductors and a location of the power semiconductor current return path.

30. A method in accordance with claim 25 wherein the power semiconductors are positioned in a in a one-by-two configuration with respect to each other, said method comprising transposing the output conductors about an axis of symmetry defined by the relative orientation of the power semiconductors and a location of the power semiconductor current return path.

31. A method in accordance with claim 25 wherein determining a relative orientation of the power semiconductors in the semiconductor assembly comprises positioning the power semiconductors in a two-by-two configuration with respect to each other.

32. A method in accordance with claim 25 wherein determining a relative orientation of the power semiconductors in the semiconductor assembly comprises positioning the power semiconductors in a six-by-two configuration with respect to each other.

* * * * *

UNITED STATES PATENT AND TRADEMARK OFFICE
CERTIFICATE OF CORRECTION

PATENT NO. : 7,170,180 B2  
APPLICATION NO. : 11/017447  
DATED : January 30, 2007  
INVENTOR(S) : Wagoner It is certified that error appears in the above-identified patent and that said Letters Patent is hereby corrected as shown below:

In Claim 14, column 7, line 41, delete "(TGBT)" and insert therefor -- (IGBT) --.  
In Claim 15, column 7, line 43, delete "wit respect" and insert therefor -- with respect --.  
In Claim 20, column 7, line 57, delete "wit claim" and insert therefor -- with claim --.  
In Claim 21, column 7, line 60, delete "wit claim" and insert therefor -- with claim --.  
In Claim 25, column 8, line 15, delete "te power" and insert therefor -- the power --.

Signed and Sealed this

Eighteenth Day of September, 2007

JON W. DUDAS  
*Director of the United States Patent and Trademark Office*